(12) United States Patent
Yen et al.

(10) Patent No.: US 9,059,168 B2
(45) Date of Patent: Jun. 16, 2015

(54) ADJUSTABLE MEANDER LINE RESISTOR

(75) Inventors: Hsiao-Tsung Yen, Tainan (TW);
Yu-Ling Lin, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 174 days.

(21) Appl. No.: 13/365,021

(22) Filed: Feb. 2, 2012

(65) Prior Publication Data

US 2013/0200447 A1 Aug. 8, 2013

(51) Int. Cl.
| | | |
|---|---|---|
| *H01L 29/00* | (2006.01) | |
| *H01L 23/522* | (2006.01) | |
| *H01L 23/64* | (2006.01) | |
| *H01L 49/02* | (2006.01) | |
| *H01L 27/06* | (2006.01) | |
| *H01L 27/108* | (2006.01) | |
| *H01L 27/08* | (2006.01) | |

(52) U.S. Cl.
CPC .......... *H01L 23/5228* (2013.01); *H01L 23/647* (2013.01); *H01L 27/10897* (2013.01); *H01L 28/20* (2013.01); *H01L 27/0629* (2013.01); *H01L 27/0802* (2013.01)

(58) Field of Classification Search
CPC .......................... H01L 23/5228; H01L 23/647
See application file for complete search history.

(56) References Cited

U.S. PATENT DOCUMENTS

| | | | | |
|---|---|---|---|---|
| 5,164,699 A | * | 11/1992 | Smith et al. | 338/310 |
| 5,361,001 A | | 11/1994 | Stolfa | |
| 5,717,323 A | | 2/1998 | Tailliet | |
| 6,587,320 B1 | * | 7/2003 | Russ et al. | 361/56 |
| 6,700,203 B1 | | 3/2004 | Cabral, Jr. et al. | |
| 6,958,522 B2 | * | 10/2005 | Clevenger et al. | 257/532 |
| 7,129,767 B2 | * | 10/2006 | Brindle et al. | 327/436 |
| 8,039,354 B2 | | 10/2011 | Chinthakindi et al. | |
| 2001/0019288 A1 | | 9/2001 | Wada et al. | |
| 2002/0027251 A1 | * | 3/2002 | Nagaya | 257/355 |
| 2004/0227205 A1 | | 11/2004 | Walmsley | |
| 2005/0266651 A1 | * | 12/2005 | Taylor et al. | 438/382 |
| 2006/0231887 A1 | | 10/2006 | Kim et al. | |
| 2006/0249812 A1 | * | 11/2006 | Sakurabayashi et al. | 257/532 |
| 2006/0266646 A1 | * | 11/2006 | Kimura | 204/425 |
| 2007/0284662 A1 | * | 12/2007 | Chinthakindi et al. | 257/350 |
| 2013/0168815 A1 | | 7/2013 | Le Neel et al. | |
| 2014/0332871 A1 | * | 11/2014 | Kim et al. | 257/296 |

FOREIGN PATENT DOCUMENTS

| | | |
|---|---|---|
| DE | 69509735 T2 | 10/1999 |
| JP | 2004040009 A | 2/2004 |
| JP | 2007036151 A | 2/2007 |
| KR | 20010087243 A | 9/2001 |
| KR | 20060108960 A | 10/2006 |

* cited by examiner

*Primary Examiner* — Benjamin Sandvik
(74) *Attorney, Agent, or Firm* — Slater & Matsil, L.L.P

(57) ABSTRACT

An adjustable meander line resistor comprises a plurality of series circuits. Each series circuit comprises a first resistor formed on a first doped region of a transistor, a second resistor formed on a second doped region of the transistor and a connector coupled between the first resistor and the second resistor. A control circuit is employed to control the on and off of the transistor so as to achieve the adjustable meander line resistor.

20 Claims, 6 Drawing Sheets

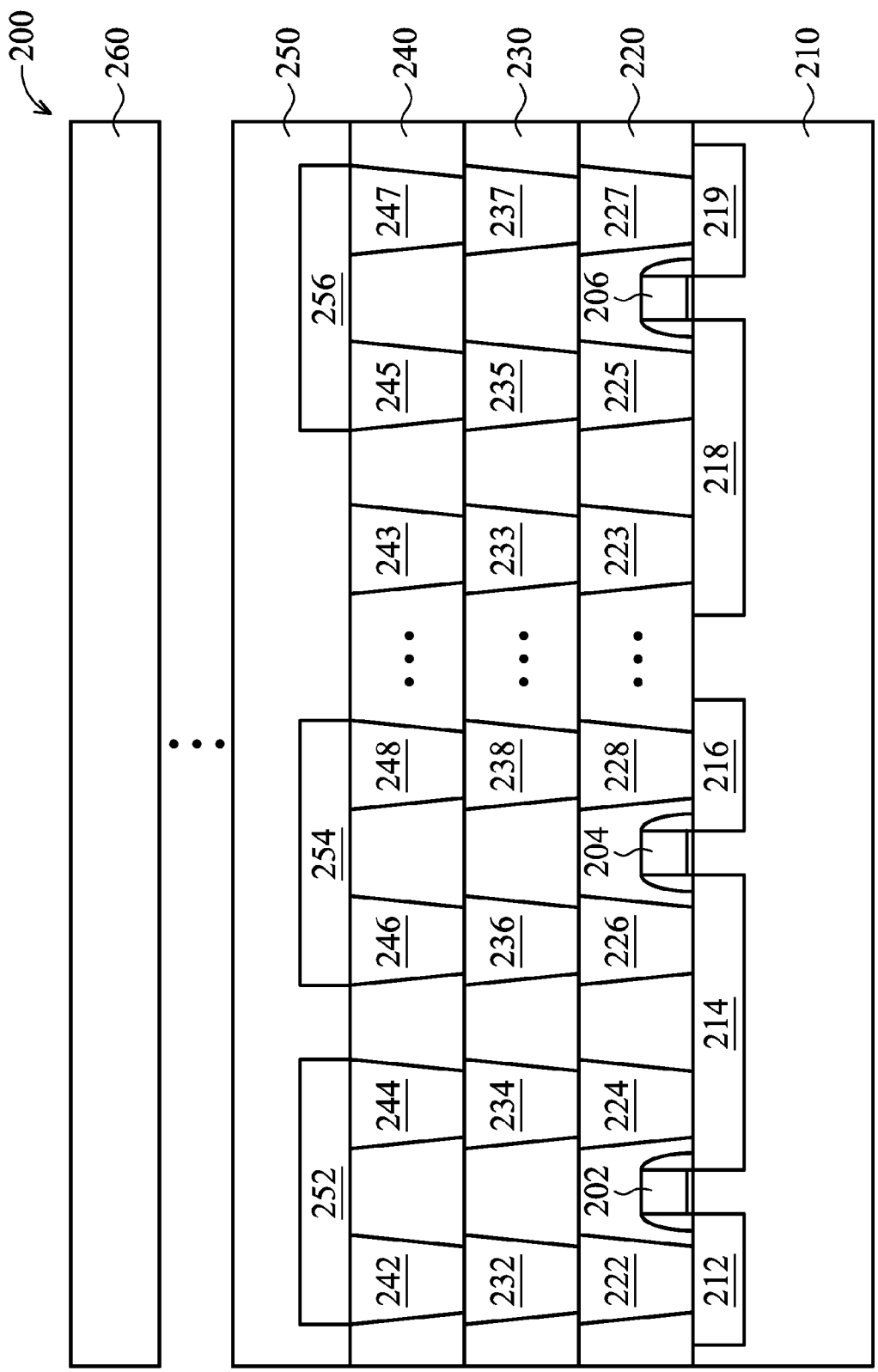

US 9,059,168 B2

ADJUSTABLE MEANDER LINE RESISTOR

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As the demand for miniaturization, higher speed and greater bandwidth, as well as lower power consumption and latency has grown recently, there has grown a need for smaller and more creative packaging techniques of semiconductor dies.

Modern electronic devices such as a notebook computer comprise a variety of memories to store information. Memory circuits include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered. On the other hand, non-volatile memories can keep data stored on them permanently unless an electrical charge is applied to non-volatile memories. Non-volatile memories include a variety of sub-categories, such as electrically erasable programmable read-only memory (EEPROM) and flash memory.

A DRAM circuit may comprise a plurality of DRAM memory cells arranged in rows and columns. A DRAM cell is made up of a single metal oxide semiconductor (MOS) transistor and a storage capacitor connected in series. The MOS transistor functions as a switch coupled between a bit line and an electrode of the storage capacitor. The other electrode of the storage capacitor is connected to the corresponding electrodes of the other cells on the same column and is biased to a plate voltage. The storage capacitor contains one bit of information. By enabling a word line coupled to the gate of the MOS transistor, data stored in the storage capacitor can be written in or read out. In particular, during a write operation, the data to be written is placed on the bit line. By turning on the MOS transistor, the storage capacitor will be either charged or discharged depending on the data bit and the original logic state of the storage capacitor. On the other hand, during a read operation, the bit line is pre-charged to a voltage. By turning on the MOS transistor, the voltage change on the bit line indicates the logic state of the storage capacitor.

As semiconductor technologies evolve, embedded DRAM (EDRAM) based semiconductor devices have emerged as an effective solution to further reduce the physical size of a semiconductor chip and improve the performance of memory circuits and logic circuits as a whole. EDRAM is fabricated on the same die as its accompanying CPU processors. Integrating EDRAM with logic circuits on one single die helps to achieve faster read and write speeds, lower power and smaller form factors.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 2 illustrates a cross sectional view of an adjustable meander line resistor structure in accordance with an embodiment.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, an adjustable meander line resistor in an embedded dynamic random access memory (EDRAM) device. The embodiments of the disclosure may also be applied, however, to a variety of semiconductor devices.

Figure 1A:
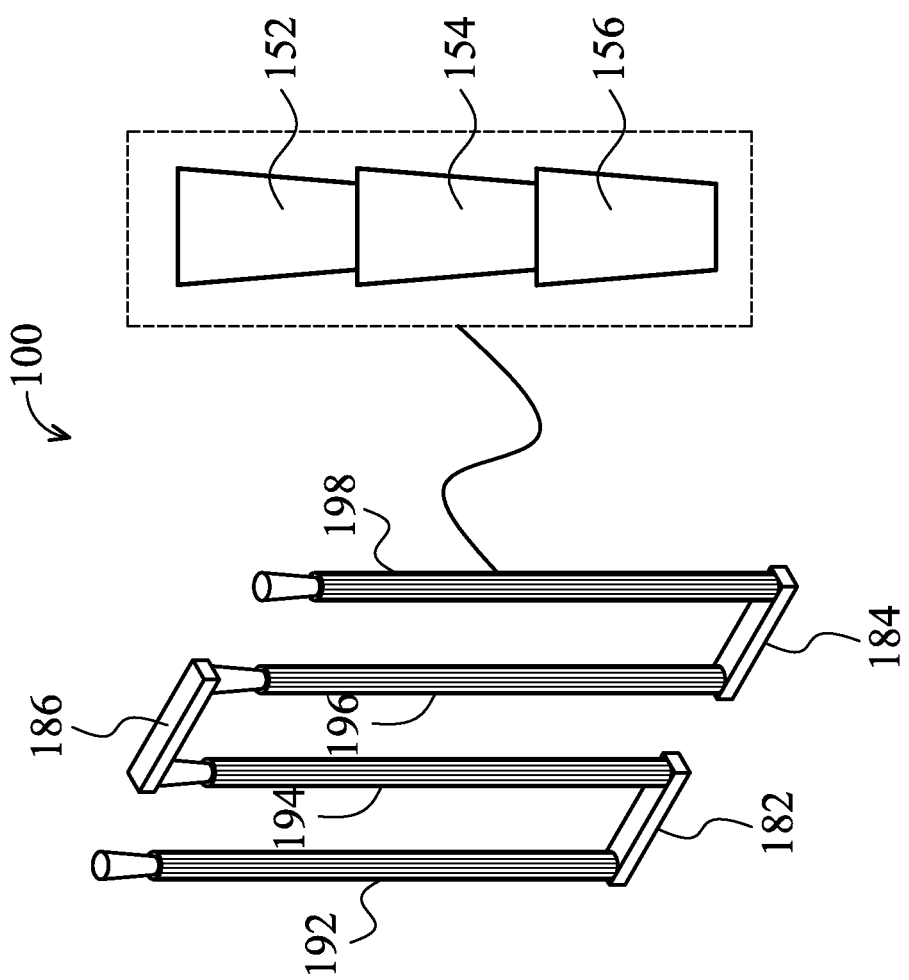
FIG. 1A illustrates a perspective view of a meander line resistor structure is illustrated in accordance with an embodiment.

Referring initially to FIG. 1A, a perspective view of a meander line resistor structure is illustrated in accordance with an embodiment. The meander line resistor structure 100 may comprise a plurality of resistors connected in series. As shown in FIG. 1A, the meander line resistor structure 100 may comprise a first resistor 192, a second resistor 194, a third resistor 196 and a fourth resistor 198. The meander line resistor structure 100 may further comprise a plurality of connectors, namely a first connector 164, a second connector 166 and a third connector 168. The connectors shown in FIG. 1A may be doped regions of a semiconductor device. Alternatively, the connectors shown in FIG. 1A may be poly connectors or active layer (OD) connectors.

As shown in FIG. 1A, the first connector 164 is used to connect the first resistor 192 and the second resistor 194. Likewise, the second connector 166 and the third connector 168 are employed to connect other resistors so as to form a meander line resistor structure. It should be recognized that while FIG. 1A illustrates the meander line resistor structure 100 with four resistors connected in series, the meander line resistor structure 100 could accommodate any number of resistors. A meander line resistor structure formed by four resistors is illustrated for simplicity.

Each resistor (e.g., the fourth resistor 198) shown in FIG. 1A may be formed by a plurality of semiconductor vias connected in series. In accordance with an embodiment, each resistor (e.g., the fourth resistor 198) may be formed by three vias 152, 154 and 156. It should further be noted while FIG. 1A illustrates three vias connected in series, each resistor may accommodate any number of vias connected in series. Furthermore, the connection of vias illustrated herein is limited solely for the purpose of clearly illustrating the inventive aspects of the various embodiments. One of ordinary skill in the art would recognize many variations, alternatives, and modifications. For example, the fourth resistor 198 may comprise a plurality of sub-resistors connected in parallel and each sub-resistor may comprise a plurality of vias connected in series.

In accordance with an embodiment, the length of the resistors (e.g., fourth resistor 198) is in a range from 200 nm to 1 um. In accordance with an embodiment, when the length of the resistor formed by three vias (e.g., fourth resistor 198) is about 740 nm, the total resistance of these three vias is about 871.99 ohms. As shown in FIG. 1A, the meander line resistor structure 100 is formed by four resistors connected in series. As a result, the total resistance of the meander line resistor structure 100 is approximately equal to four times 871.99 ohms. In addition, one skilled in the art will recognize that the connectors (e.g., first connector 164) may introduce additional resistance, which is minimal in consideration of the resistance of the resistors (e.g., the fourth resistor 198).

The meander line resistor structure 100 may be formed on top of active regions of a semiconductor device. The detailed formation of the meander line resistor structure 100 will be described below with respect to FIG. 2 and FIG. 3. One advantageous feature of having a meander line resistor structure is that the meander line resistor structure shown in FIG. 1A helps to reduce the form factor of a semiconductor resistor so as to achieve a compact semiconductor resistor.

In accordance with an embodiment, the distance between two adjacent resistors (e.g., the first resistor 192 and the second resistor 194) is in a range from 0.03 um to 5 um. It should be noted that the distance described above is merely an example. It may vary depending on different processes. For example, in a 65 nm process, the distance may be in a range from 0.1 um to 1 um. Another advantageous feature of having a meander line resistor structure on top of active regions (not shown but illustrated in FIG. 2 and FIG. 3) of a semiconductor device is that some parasitic parameters such as substrate capacitance may be reduced because the meander line resistor structure is not embedded in the substrate. In accordance with an embodiment, when the distance between two adjacent resistors is approximately equal to 0.054 um, the parasitic capacitance of two adjacent resistors is about 0.0125 pF. It should be noted that the parasitic capacitance 0.01256 pF is merely an example. The parasitic capacitance between two adjacent resistors may vary depending on different applications and processes. In sum, the meander line resistor structure shown in FIG. 1A may help to reduce the parasitic inductance of a semiconductor resistor.

Figure 1B:
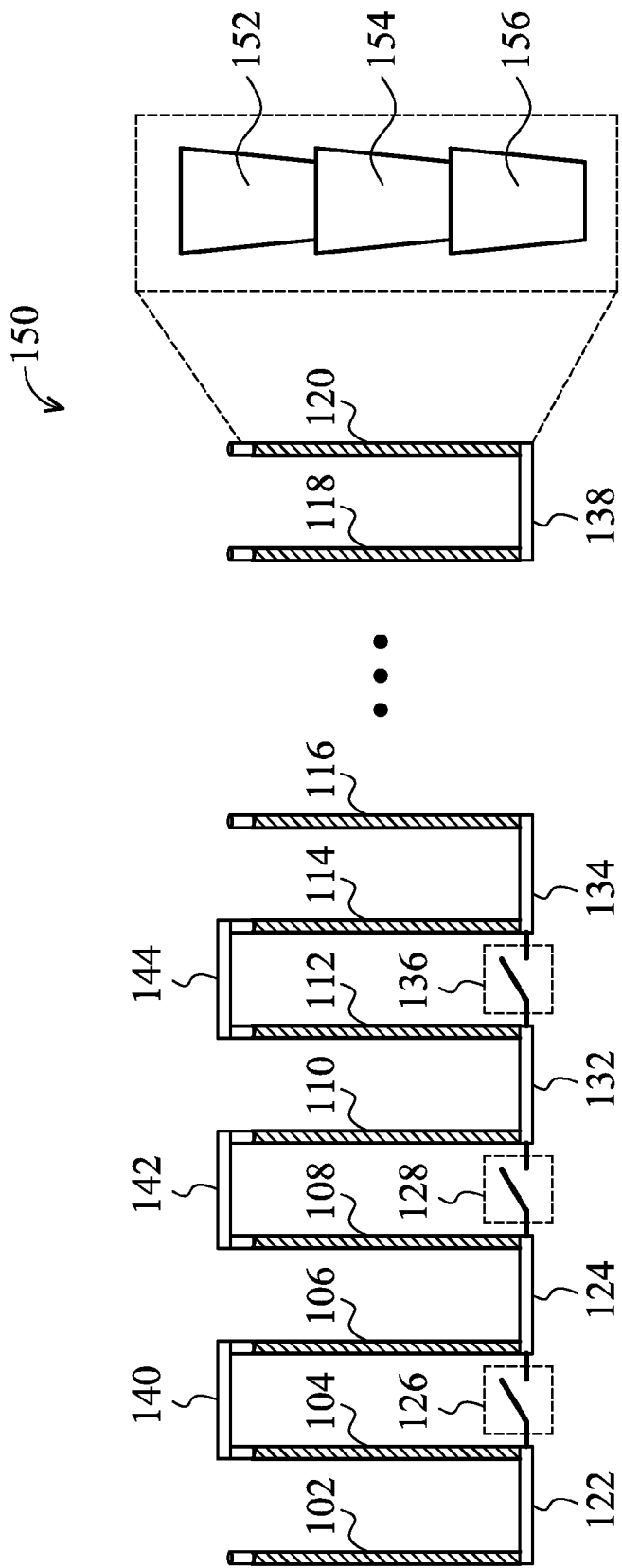
FIG. 1B illustrates an adjustable meander line resistor in accordance with an embodiment.

FIG. 1B illustrates an adjustable meander line resistor in accordance with an embodiment. The adjustable meander line resistor 150 may comprise a plurality of resistors connected in series. As shown in FIG. 1B, the adjustable meander line resistor 150 may comprise a first resistor 102, a second resistor 104, a third resistor 106, a fourth resistor 108, a fifth resistor 110, a sixth resistor 112, a seventh resistor 114, an eighth resistor 116, a ninth resistor 118 and a tenth resistor 120. The adjustable meander line resistor 150 may further comprise a plurality of connectors, namely a first connector 140, a second connector 142 and a third connector 144.

As shown in FIG. 1B, the first connector 140 is used to connect the second resistor 104 and the third resistor 106. Likewise, the second connector 142 and the third connector 144 are employed to connect other resistors so as to form a meander line resistor structure. It should be recognized that while FIG. 1B illustrates the adjustable meander line resistor 150 with ten resistors connected in series, the adjustable meander line resistor 150 could accommodate any number of resistors. An adjustable meander line resistor formed by ten resistors is illustrated for simplicity.

In order to adjust the resistance of the meander line resistor structure shown in FIG. 1B, the adjustable meander line resistor 150 may further comprise a plurality of switches, namely first switch 126, second switch 128 and third switch 136. Each switch (e.g., first switch 126) is connected in parallel with two adjacent resistors. For example, the second resistor 104 and the third resistor 106 are connected in series using the first connector 140. The first switch 126 is connected in parallel with the series connected resistors 104 and 106. Furthermore, by turning on the first switch 126, the second resistor 104 and the third resistor 106 may be bypassed. As a result, the first resistor 102 is connected to the fourth resistor 108 through the turned on switch 126. Similarly, by turning other switches shown in FIG. 1 (e.g., switches 128 and 136), the other resistors can be selected to be included or excluded from the adjustable meander line resistor 150.

Each resistor (e.g., the tenth resistor 120) shown in FIG. 1B may be formed by a plurality of semiconductor vias connected in series. In accordance with an embodiment, each resistor (e.g., the tenth resistor 120) may be formed by three vias 152, 154 and 156. The physical characteristics of the vias (e.g., via 152) have been described above with respect to FIG. 1A, and hence are not discussed in further detail herein to avoid repetition.

The adjustable meander line resistor 150 may be formed on top of active regions of a semiconductor device. For example, the second resistor 104 and the third resistor 106 are formed on a first doped region 122 and a second doped region 124 respectively. Furthermore, the first doped region 122, the second doped region 124 and a gate stack may form the switch 126. As such, the second resistor 104 and the third resistor 106 are connected to the switch 126. The detailed formation of the adjustable meander line resistor 150 will be described below with respect to FIG. 2 and FIG. 3. One advantageous feature of having an adjustable meander line resistor is that the meander line resistor structure shown in FIG. 1B helps to reduce the form factor of a semiconductor resistor so as to achieve a compact semiconductor resistor. In addition, by employing an on and off control of the switches, different resistance values can be obtained in consideration of different applications.

Figure 1C:
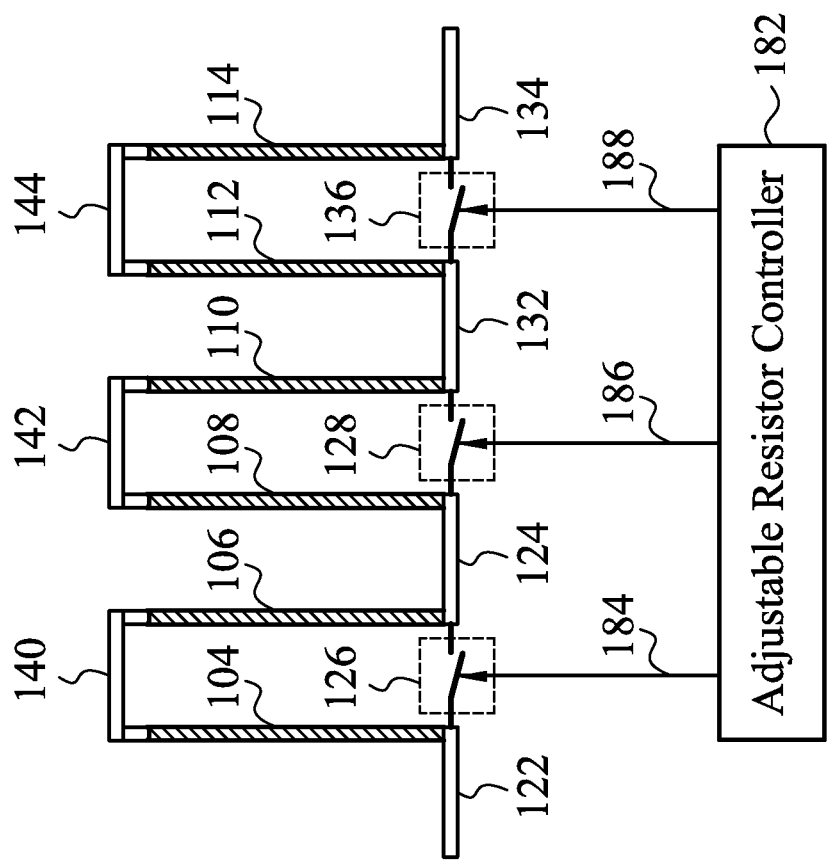
FIG. 1C illustrates a schematic diagram of a control circuit of an adjustable meander line resistor in accordance with an embodiment.

FIG. 1C illustrates a schematic diagram of a control circuit of an adjustable meander line resistor in accordance with an embodiment. As shown in FIG. 1C, there may be an adjustable resistor controller 182 coupled to the adjustable meander line resistor. In particular, the adjustable resistor controller 182 may generate three gate drive signals 184, 186 and 188 for switch 126, switch 128 and switch 136 respectively. By enabling different switches, the total resistance of the meander line resistor may vary accordingly. For example, by turning on the third switch 136, the resistors 112 and 114 will be bypassed. One skilled in the art will recognize that there may be eight different combinations by manipulating three switches. As such, an adjustable resistor having eight steps may be achieved. Furthermore, it should be noted that this diagram is merely an example, which should not unduly limit the scope of the claims. One of ordinary skill in the art would recognize many variations, alternatives, and modifications.

For example, the adjustable meander line resistor could accommodate any number of resistors and switches.

Figure 1D:
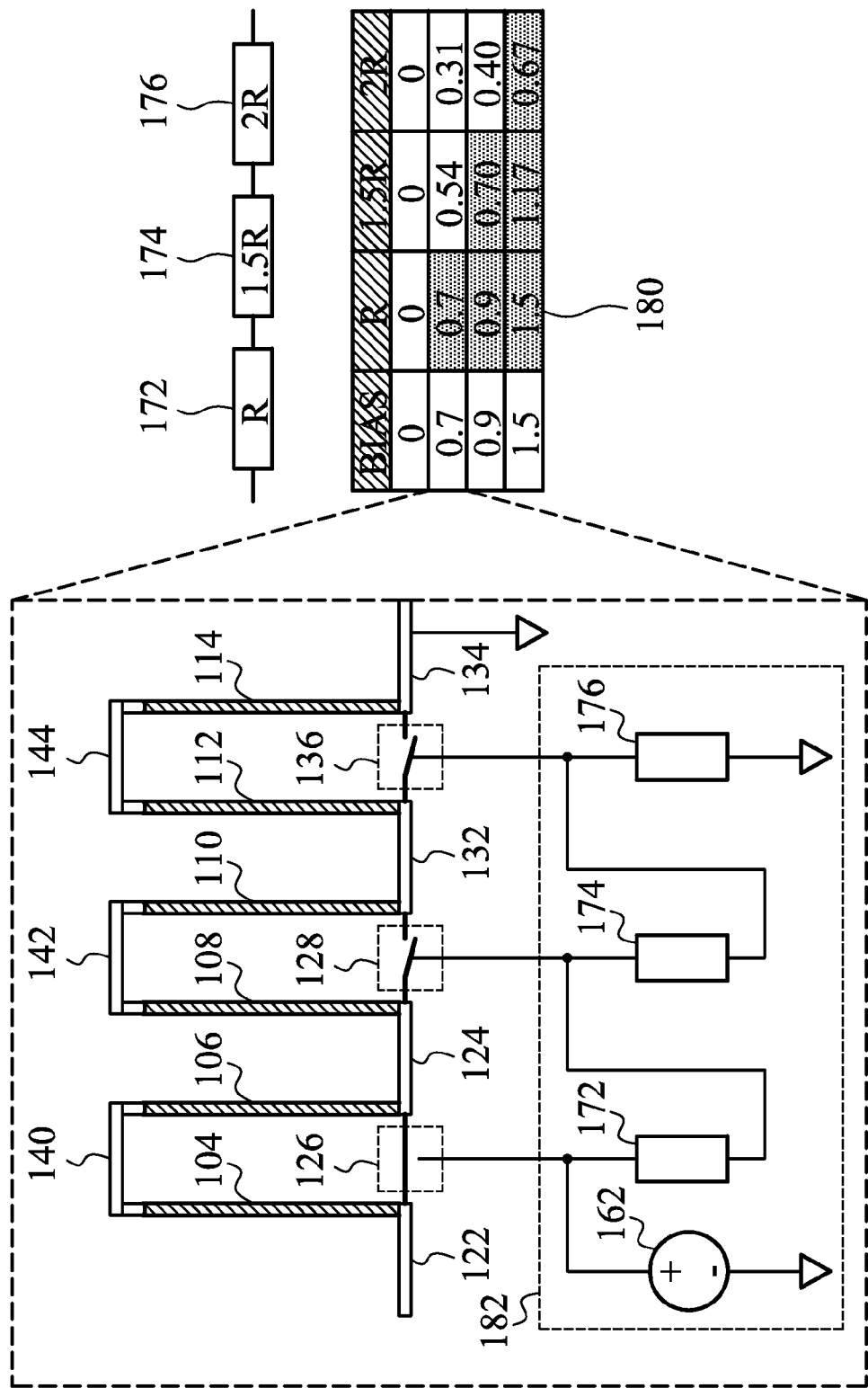
FIG. 1D illustrates an embodiment control circuit of an adjustable meander line resistor in accordance with an embodiment.

FIG. 1D illustrates an embodiment control circuit of an adjustable meander line resistor in accordance with an embodiment. The adjustable resistor controller 182 comprises a bias voltage source 162 and a plurality of resistors connected in series. In accordance with an embodiment, the resistor of the adjustable resistor controller (e.g., resistor 172) may be a poly resistor. The poly resistors 172, 174 and 176 form a voltage divider between the bias voltage source 162 and ground. Furthermore, the voltage at each level of the voltage divider (e.g., a joint point between resistor 172 and resistor 174) is further coupled to a gate of a corresponding switch. As such, the switch (e.g., switch 136) can be turned on or off by adjusting the bias voltage source 162.

In order to better illustrate the operation of the adjustable resistor controller 182 shown in FIG. 1D, an example is illustrated in a table 180. As shown in the table 180, the first resistor 172, the second resistor 174 and the third resistor 176 are defined to be R, 1.5R and 2R respectively. One skilled in the art will recognize that the resistance of a poly resistor can be adjusted by changing either the width or length of the poly resistor. The values of resistors 172, 174 and 176 shown in FIG. 1D are merely an example. Other resistance values may be applicable in consideration with different applications. Furthermore, while FIG. 1D shows the divider is formed by a plurality of resistors (e.g., resistor 172), the divider can be formed by other passive components. For example, the divider can be formed by a plurality of capacitors. In accordance with an embodiment, the capacitors can be metal oxide silicon varactor (MOSVAR), metal insulator metal (MIM) capacitor, metal oxide metal (MOM) capacitor or the like.

FIG. 1D further illustrates an adjustable meander line resistor may be obtained by adjusting a bias voltage source. As shown in the table 180, by applying different bias voltages, the voltage across each resistor (e.g., resistor 176) varies accordingly. For example, when the bias voltage is set to be zero, the voltage across each resistor is equal to zero. As a result, all resistors (e.g., 104, 106, 108, 110, 112 and 114) are included into the meander line resistor. On the other hand, when the bias voltage is increase to 0.7V, the voltage at the gate of the switch 126 is up to 0.7V, which is high enough to turn on the switch 126. As a result, the resistor 104 and the resistor 106 are bypassed and not included in the adjustable meander line resistor. Similarly, by further increasing the bias voltage, additional switches may be turned on accordingly. As such, an adjustable meander line resistor may be obtained by controlling the bias voltage source 162.

FIG. 2 illustrates a cross sectional view of an adjustable meander line resistor structure in accordance with an embodiment. As shown in FIG. 2, the semiconductor device 200 may comprise a plurality of semiconductor layers. A substrate 210 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The substrate 210 may comprise a variety of electrical circuits (not shown). The electrical circuits formed on the substrate 210 may be any type of circuitry suitable for a particular application. In accordance with an embodiment, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like. One of ordinary skill in the art will appreciate that the above examples are provided for illustrative purposes only to further explain applications of the present disclosure and are not meant to limit the present disclosure in any manner.

As shown in FIG. 2, the substrate 210 may comprise a plurality of doped regions, namely a first doped region 212, a second doped region 214, a third doped region 216, a fourth doped region 218 and a fifth doped region 219. Doped regions (e.g., first doped region 212) may be formed in the substrate 210 on opposing sides of a gate stack 202. In an embodiment in which the substrate 210 is an n-type substrate, the doped regions (e.g., first doped region 212) may be formed by implanting appropriate p-type dopants such as boron, gallium, indium or the like. Alternatively, in an embodiment in which the substrate 210 is a p-type substrate, the doped regions (e.g., first doped region 212) may be formed by implanting appropriate n-type dopants such as phosphorous, arsenic or the like. It should be noted that the first doped region 212, the second doped region 214 and the gate stack 202 may form a first switch. Similarly, the second doped region, the third doped region 216 and the gate stack 204 may form a second switch.

The first interlayer dielectric (ILD) layer 220 may be formed over the substrate 210. The first ILD layer 220 may be formed by chemical vapor deposition, sputtering, or any other methods known and used in the art for forming an ILD. The first ILD layer 220 may comprise doped or undoped silicon oxide, although other materials such as silicon nitride doped silicate glass, high-k materials, combinations of these, or the like, may alternatively be utilized. After formation, the first ILD layer 220 may be planarized using suitable techniques such as a chemical mechanical polish (CMP) process.

The second ILD layer 230 may be formed over the first ILD layer 220 and the third ILD layer 240 may be formed over the second ILD layer 230. The fabrication processes of the second ILD layer 230 and the third ILD layer 240 are similar to that of the first ILD layer 220, and hence are not described in further detail herein. As shown in FIG. 2, there may be a plurality of vias formed in each ILD layer. In particular, in the first ILD layer 220, a via 222 is formed over a first active region 212. Vias 224 and 226 are formed over a second active region 214. A via 228 is formed over a third active region 216. Similarly, vias 223, 225 and 227 are formed over the fourth and fifth active regions respectively. In the second ILD layer 230, vias 232, 234, 236, 238, 233, 235 and 237 are formed over vias 222, 224, 226, 228, 223, 225 and 227 respectively. In the third ILD layer 240, vias 242, 244, 246, 248, 243, 245 and 247 are formed over vias 232, 234, 236, 238, 233, 235 and 237 respectively. As a result, vias 222, 232 and 242 form a first resistor. Likewise, other vias form other resistors.

Furthermore, by using an interconnector (e.g., first interconnector 252 of a bottom metallization layer 250), two adjacent resistors shown in FIG. 2 are connected in series to form a series resistor circuit. Moreover, a plurality of series resistor circuits are further connected together to form a meander line resistor structure. FIG. 2 further illustrates a plurality of switches, each of which is connected in parallel with its corresponding series resistor circuit. For example, the first doped region 212, the first gate 202 and the second doped region 214 form a first switch, which is connected in parallel with the first series resistor circuit (vias 222, 232, 242, connector 252, vias 244, 234 and 224). By controlling the on and off of the first switch, the first series resistor circuit will be included in or exclude from the adjustable meander line resistor.

The bottom metallization layer 250 is formed over the third ILD layer 240. As shown in FIG. 2, the bottom metallization layer 250 comprises a plurality of interconnectors (e.g., first connector 252). The interconnectors (e.g., first interconnector 252) are formed of metal materials such as copper or copper alloys and the like. Likewise, the top metallization layer 260 comprises a plurality of interconnectors (not shown). The metallization layers 250 and 260 may be formed through any suitable techniques such as deposition, damascene and the like.

It should be noted while FIG. 2 shows the bottom metallization layer 250 and the top metallization layer 260, one skilled in the art will recognize that one or more inter-metal dielectric layers (not shown) and the associated metallization layers (not shown) are formed between the bottom metallization layer 250 and the top metallization layer 260. In particular, the layers between the bottom metallization layer 250 and the top metallization layer 260 may be formed by alternating layers of dielectric (e.g., extremely low-k dielectric material) and conductive materials (e.g., copper).

Figure 3:
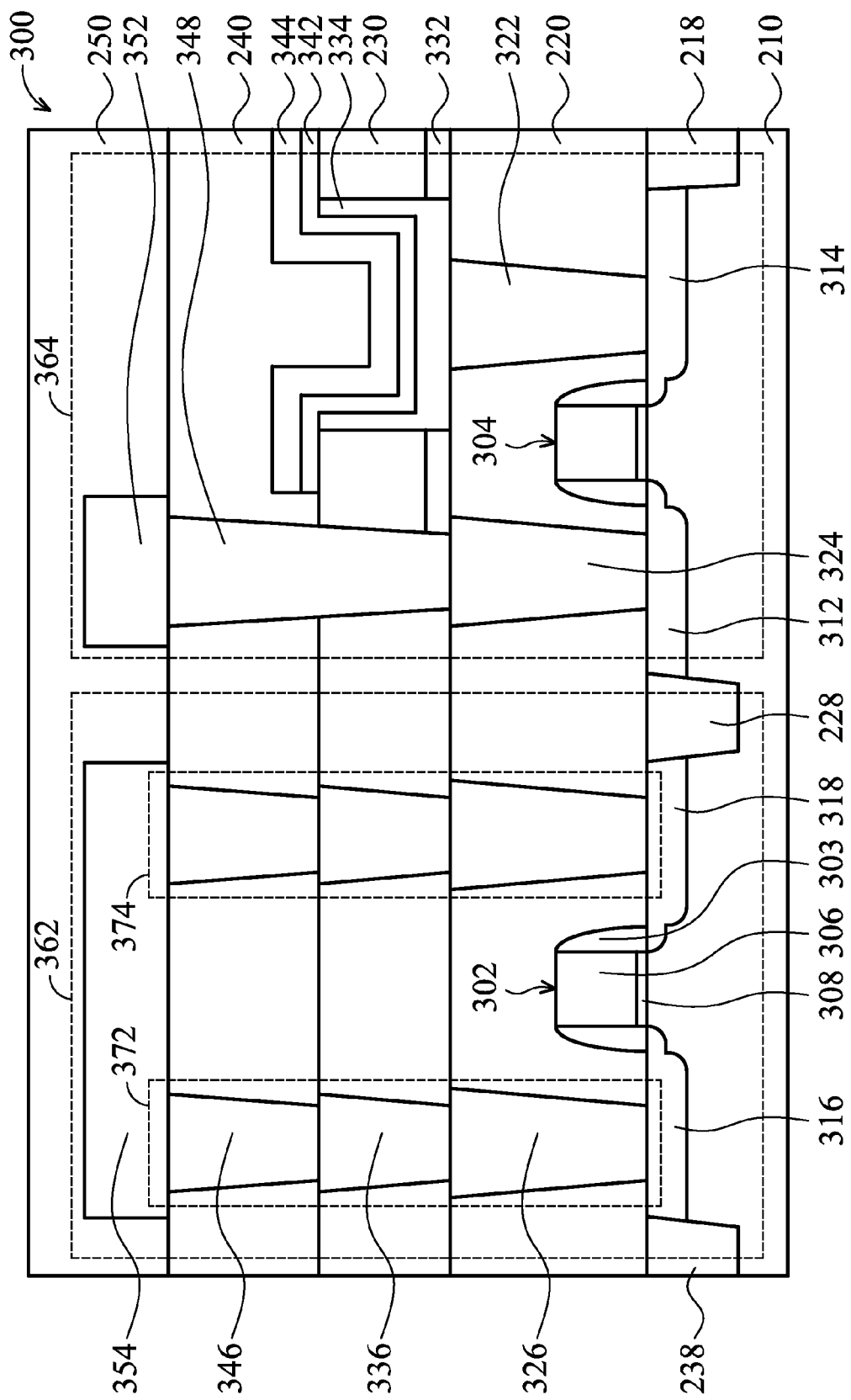
FIG. 3 illustrates a cross sectional view of an adjustable meander line resistor structure and an embedded dynamic random access memory cell in accordance with an embodiment.

FIG. 3 illustrates a cross sectional view of a meander line resistor structure and an EDRAM cell in accordance with an embodiment. A meander line resistor structure 362 may be fabricated in the same semiconductor die as an embedded DRAM cell 364. The semiconductor die 300 may comprise a substrate 210, a first ILD 220, a second ILD 230, a third ILD layer 240 and a first metallization layer 250. The fabrication process of each layer (e.g., first ILD 220) has been described above with respect to FIG. 2, and hence is not discussed herein to avoid unnecessary repetition.

As shown in FIG. 3, the substrate 210 may comprise a plurality of isolation regions (e.g., first isolation region 218) and a plurality of active regions (e.g., first active region 316). The first active region 316 and the second region 318 form the source and drain regions of the first MOS transistor 302. The third active region 312 and the fourth active region 314 form the source and drain regions of the second MOS transistor 304. The first MOS transistor 302 and the second MOS transistor 304 are separated by a second isolation region 228.

The isolation regions (e.g., second isolation region 228) may be shallow trench isolation (STI) regions, and may be formed by etching the substrate 210 to form a trench and filling the trench with a dielectric material. In accordance with an embodiment, the isolation regions may be filled with a dielectric material such as an oxide material, a high-density plasma (HDP) oxide or the like.

The first MOS transistor 302 and the second MOS transistor 304 further comprise gate stacks formed in the first ILD layer 220. The gate stacks may comprise gate dielectrics 308, gate electrodes 306, and spacers 303. The gate dielectrics 308 may be a dielectric material such as silicon oxide, silicon oxynitride, silicon nitride, an oxide, a nitrogen-containing oxide, a combination thereof, or the like. In accordance with an embodiment, the gate dielectrics 308 may comprise an oxide layer formed by suitable oxidation processes such as a wet or dry thermal oxidation in an ambient comprising an oxide, $H_2O$, NO, or a combination thereof.

The gate electrodes 306 may comprise conductive materials such as metals (e.g., tantalum, titanium, molybdenum, tungsten, platinum, aluminum, hafnium, ruthenium and the like), metal silicide materials (e.g., titanium silicide, cobalt silicide, nickel silicide, tantalum silicide and the like), metal nitride materials (e.g., titanium nitride, tantalum nitride and the like), doped poly-crystalline silicon, other conductive materials, combinations thereof. In accordance with an embodiment, the gate electrodes 306 may be poly-silicon formed by depositing doped or undoped poly-silicon by low-pressure chemical vapor deposition (LPCVD). The spacers 303 may be formed by blanket depositing one or more spacer layers (not shown) over the gate electrodes 306 and the substrate 210. The spacer layers may comprise SiN, oxynitride, SiC, SiON, oxide, and the like and may be formed by commonly used methods such CVD, plasma enhanced CVD, sputter, and other suitable techniques.

The meander line resistor structure 362 is formed by a plurality of resistors (e.g., resistors 372 and 374), each of which is formed on an active region of substrate 210. In particular, a first resistor 372 is formed on a first doped region 316 and a second resistor 374 is formed on a second doped region 318. As shown in FIG. 3, each resistor may comprise three vias connected in series. For example, the first resistor 372 comprises the first via 326, the second via 336 and the third via 346. The first via 326, the second via 336 and the third via 346 are located in the first ILD layer 220, the second ILD layer 230 and the third ILD layer 240 respectively. The interconnector 354 connects the first resistor 372 and the second resistor 374 in series.

For simplicity, the meander line resistor structure 362 comprises two resistors connected in series. However, a person skilled in the art will recognize that the meander line resistor structure 362 may accommodate any number of resistors connected in series. In addition, while FIG. 3 illustrates a single via in each ILD layer (e.g., second via 336 in the second ILD layer 230), this diagram is merely an example, which should not unduly limit the scope of the claims. One of ordinary skill in the art would recognize many variations, alternatives, and modifications. For example, the second via 336 may be replaced by a plurality of second ILD layer vias connected in parallel.

The EDRAM cell 364 may comprise the second MOS transistor 304 and a capacitor formed by a first capacitor plate 334, a capacitor dielectric layer 342 and a second capacitor plate 344. As shown in FIG. 3, after the first ILD layer 220 layer has been formed, a capacitor contact 322 and a lower bit line contact 324 may be formed through the first ILD layer 220. In an embodiment the capacitor contact 322 may be formed to provide an electrical connection between the fourth active region 314 and the first capacitor plate 334. The lower bit line contact 324 may be formed to provide an electrical connection between the third active region 312 and an upper bit line contact 348.

The capacitor contact 322 and the lower bit line contact 324 may be formed by suitable techniques such as a damascene process. It should be noted that the capacitor contact 322 and the lower bit line contact 324 may comprise one or more layers of conductive material. For example, the capacitor contact 322 and the lower bit line contact 324 may include barrier layers, adhesive layers, multiple conductive layers or the like.

The first etch stop layer 332 may be formed over the first ILD layer 220 in order to provide a control point for a subsequent etch process. The first etch stop layer 332 may be a dielectric material such as SiN, SiON or the like. In accordance with an embodiment the first etch stop layer 322 may be formed using any suitable processes such as CVD, PECVD, ALD or the like.

Once the second ILD layer 230 has been formed, the second ILD layer 230 and the first etch stop layer 332 may be patterned in order to expose the underlying capacitor contact 322 and to provide an opening in the second ILD layer 230 in which the first capacitor plate 334 may be formed. The second ILD layer 230 and the first etch stop layer 332 may be patterned using suitable photolithographic masking and etching processes. Once the second ILD layer 230 and the first etch stop layer 332 have been patterned, the first capacitor plate 334 may be formed in electrical contact with the capacitor contact 322. The first capacitor plate 334 may be formed by depositing and patterning a layer of conductive material such as TiN, TaN, ruthenium or the like. The first capacitor plate 224 may be formed by suitable techniques such as CVD, ALD or the like. The capacitor dielectric layer 342 is formed over the first capacitor plate 334. The capacitor dielectric layer 342 is formed of capacitive dielectric materials such as silicon oxide capacitive dielectric materials, silicon nitride capacitive dielectric materials, silicon oxynitride capacitive dielectric materials and/or the like. The second capacitor plate 344 may be formed of a conductive material such as TiN, TaN, ruthenium, aluminum, tungsten, copper, combinations of these or the like. The second capacitor plate 344 may be formed by using a suitable process such as CVD, PECVD, ALD or the like.

After the third ILD layer 240 has been formed, the upper bit line contact 348 may be formed to extend through the third ILD layer 240 and the second ILD layer 230. The upper bit line contact 348 may be formed using any suitable techniques such as a damascene process. It should be noted that the upper bit line contact 348 may comprise one or more layers of conductive material. For example, the upper bit line contact 348 may include barrier layers, adhesive layers, multiple conductive layers or the like. The bit line 352 may be electrically coupled with the third active region 312 in the substrate 210 through the lower bit line contact 324 and the upper bit line contact 348. The bit line 352 may be formed by suitable techniques such as a damascene process.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
a substrate comprising a plurality of active regions;
a plurality of gate stacks disposed over the substrate wherein each gate stack is formed between two adjacent active regions;
a first resistor having a first bottom terminal disposed over and in direct contact with a first active region of the plurality of active regions and a first upper terminal coupled to a first connector, wherein the first resistor is formed by a plurality of first vias connected in series, and wherein two adjacent first vias are in direct contact to each other, and wherein a bottom via of the first resistor and the gate stacks are formed in an interlayer dielectric layer;
a second resistor having a second bottom terminal disposed over and in direct contact with a second active region of the plurality of active regions and a second upper terminal coupled to the first connector;
a switch formed by the first active region, the second active region and a first gate of the plurality of gate stacks, wherein the first active region, the first resistor, the first connector, the second resistor and the second active region form a U-shaped structure and the first gate is surrounded by the U-shaped structure; and
a third resistor having a third bottom terminal disposed over and in direct contact with the second active region, wherein the third bottom terminal of the third resistor is coupled to the second bottom terminal of the second resistor.

2. The apparatus of claim 1, wherein:
the second resistor is formed by a plurality of second vias connected in series; and
the third resistor is formed by a plurality of third vias connected in series.

3. The apparatus of claim 2, further comprising:
a first interlayer dielectric layer formed over the substrate, wherein one of the first vias, one of the second vias and one of the third vias are embedded in the first interlayer dielectric layer;
a second interlayer dielectric layer formed over the first interlayer dielectric layer, wherein one of the first vias, one of the second vias and one of the third vias are embedded in the second interlayer dielectric layer; and
a third interlayer dielectric layer formed over the second interlayer dielectric layer, wherein one of the first vias, one of the second vias and one of the third vias are embedded in the third interlayer dielectric layer.

4. The apparatus of claim 3, further comprising:
a first metallization layer formed over the third interlayer dielectric layer, wherein the first connector is embedded in the first metallization layer.

5. The apparatus of claim 1, wherein the first resistor, the second resistor and the third resistor form an adjustable meander line resistor.

6. The apparatus of claim 5, further comprising:
an adjustable resistor controller configured to generate a gate drive signal coupled to the first gate of the switch.

7. The apparatus of claim 5, further comprising:
a bias voltage source coupled to a voltage divider, wherein a voltage output of the voltage divider is coupled to the gate of the switch wherein the bias voltage source is configured such that:
the first resistor and the second resistor are bypassed from the meander line resistor when a gate voltage of the switch is more than a threshold voltage of the switch; and
the first resistor and the second resistor are included into the meander line resistor when the gate voltage of the switch is less than the threshold voltage of the switch.

8. A system comprising:
a first interlayer dielectric layer formed over a substrate, wherein the first interlayer dielectric layer comprises a first gate stack and a second gate stack;
a second interlayer dielectric layer formed over the first interlayer dielectric layer;
a third interlayer dielectric layer formed over the second interlayer dielectric layer;

an adjustable meander line resistor comprising:
   a first resistor formed over a first active region of the substrate;
   a second resistor formed over a second active region of the substrate;
   a third resistor formed over the second active region of the substrate; and
   a first series circuit formed by the first resistor, the second resistor and a connector connected in series;
   a first switch connected in parallel with the first series circuit, wherein the first switch comprises:
      the first gate;
      the first active region; and
      the second active region; and
a dynamic random access memory (DRAM) cell formed adjacent to the adjustable meander line resistor comprising:
   a DRAM transistor formed in the substrate, wherein the DRAM transistor comprises the second gate stack;
   a first conductive capacitor plate formed in the second interlayer dielectric layer;
   a second conductive capacitor plate formed in the third interlayer dielectric layer; and
   a capacitor dielectric layer formed between the first conductive capacitor plate and the second conductive capacitor plate.

9. The system of claim 8, further comprising:
a bit line formed over the third interlayer dielectric layer;
a first bit line contact formed in the first interlayer dielectric layer, wherein the first bit line contact is coupled to a first doped region of the DRAM transistor;
a second bit line contact formed between the bit line and the first bit line contact; and
a capacitor contact coupled to the first conductive capacitor plate, wherein the capacitor contact is coupled to a second doped region of the DRAM transistor.

10. The system of claim 8, wherein the first resistor comprises a first via, a second via and a third via connected in series, wherein:
   the first via is formed by a plurality of first interlayer vias connected in parallel;
   the second via is formed by a plurality of second interlayer vias connected in parallel; and
   the third via is formed by a plurality of third interlayer vias connected in parallel.

11. The system of claim 10, wherein:
   the first interlayer via is embedded in the first interlayer dielectric layer;
   the second interlayer via is embedded in the second interlayer dielectric layer; and
   the third interlayer via is embedded in the third interlayer dielectric layer.

12. The system of claim 8, further comprising:
a second series circuit connected to the first series circuit in series, wherein a second switch is connected to the second series circuit in parallel; and
a third series circuit connected to the second series circuit in series, wherein a third switch is connected to the third series circuit in parallel.

13. The system of claim 12, further comprising a control circuit comprising:
a bias voltage source; and
a voltage divider coupled to the bias voltage source, the first switch, the second switch and the third switch.

14. The system of claim 13, wherein the bias voltage source is configured such that:
   a first series circuit is included into the adjustable meander line resistor when a gate voltage from the voltage divider is less than a threshold voltage of the first switch; and
   a first series circuit is excluded from the adjustable meander line resistor when the gate voltage from the voltage divider is greater than the threshold voltage of the first switch.

15. A method comprising:
providing a substrate with a first conductivity type;
forming a first transistor comprising:
   forming a first doped region with a second conductivity type;
   forming a second doped region with the second conductivity type; and
   forming a first gate;
forming a first series circuit connected in parallel with the first transistor comprising:
   forming a first resistor over the first doped region, wherein the first resistor is formed by a plurality of first vias connected in series, and wherein two adjacent first vias are in direct contact to each other, and wherein a bottom via of the first resistor and the first gate are formed in an interlayer dielectric layer;
   forming a second resistor over the second doped region; and
   coupling the first resistor and the second resistor with a first connector, wherein the first doped region, the first resistor, the first connector, the second resistor and the second doped region form a U-shaped structure and the first gate is surrounded by the U-shaped structure; and
configuring a first control circuit to generate a first gate signal of the first transistor.

16. The method of claim 15, further comprising:
forming a second transistor connected in series with the first transistor comprising the second doped region, a third doped region and a second gate;
forming a second series circuit connected in parallel with the second transistor comprising:
   forming a third resistor over the second doped region;
   forming a fourth resistor over the third doped region; and
   coupling the third resistor and the fourth resistor with a second connector; and
configuring a second control circuit to generate a second gate signal of the second transistor.

17. The method of claim 16, further comprising:
depositing a first interlayer dielectric layer comprising the first gate and the second gate;
embedding a first interlayer via in the first interlayer dielectric layer;
depositing a second interlayer dielectric layer over the first interlayer dielectric layer;
embedding a second interlayer via in the second interlayer dielectric layer;
depositing a third interlayer dielectric layer over the second interlayer dielectric layer; and
embedding a third interlayer via in the third interlayer dielectric layer.

18. The method of claim 17, further comprising:
aligning the first interlayer via, the second interlayer via and the third interlayer via to form the first resistor.

19. The method of claim 15, further comprising:
forming a voltage divider using a plurality of poly resistors; and
coupling a bias voltage source with the voltage divider.

20. The method of claim 19, further comprising:
configuring the bias voltage source to generate a gate signal for controlling the first gate of the first transistor.

* * * * *